United States Patent
Caubet et al.

(10) Patent No.: US 9,029,254 B2
(45) Date of Patent: May 12, 2015

(54) METHOD FOR DEPOSITING A LOW-DIFFUSION TIALN LAYER AND INSULATED GATE COMPRISING SUCH A LAYER

(71) Applicant: STMicroelectronics Crolles 2 SAS, Crolles (FR)

(72) Inventors: Pierre Caubet, Le Versoud (FR); Florian Domengie, Crolles (FR); Sylvain Baudot, Odars (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 27 days.

(21) Appl. No.: 14/032,436

(22) Filed: Sep. 20, 2013

(65) Prior Publication Data
US 2014/0097504 A1    Apr. 10, 2014

(30) Foreign Application Priority Data
Oct. 9, 2012   (FR) ..................... 12 59614

(51) Int. Cl.
*H01L 21/28* (2006.01)
*H01L 29/78* (2006.01)
*H01L 21/02* (2006.01)
*H01L 29/66* (2006.01)

(52) U.S. Cl.
CPC .......... *H01L 29/78* (2013.01); *H01L 21/02266* (2013.01); *H01L 29/66477* (2013.01); *H01L 21/02697* (2013.01); *H01L 21/28088* (2013.01)

(58) Field of Classification Search
CPC .............. H01L 21/02697; H01L 29/66477; H01L 29/78; H01L 21/28088

USPC ................ 438/199, 283; 257/412, E21.623, 257/E21.637
See application file for complete search history.

(56) References Cited

U.S. PATENT DOCUMENTS

| 6,235,163 | B1 * | 5/2001 | Angelo et al. | 204/192.12 |
| 8,070,925 | B2 * | 12/2011 | Hoffman et al. | 204/298.08 |
| RE45,180 | E * | 10/2014 | Chen et al. | 438/700 |
| 2004/0183107 | A1 * | 9/2004 | Horii et al. | 257/257 |
| 2008/0019075 | A1 * | 1/2008 | Sawasaki et al. | 361/301.4 |
| 2008/0054328 | A1 * | 3/2008 | Wang | 257/306 |

(Continued)

FOREIGN PATENT DOCUMENTS

| WO | 2010045037 A2 | 4/2010 | |
| WO | WO 2010045037 A2 * | 4/2010 | ............. H01J 37/34 |
| WO | 2011109203 A2 | 9/2011 | |

OTHER PUBLICATIONS

Anderson et al., "Deposition, Microstructure and Mechanical and Tribological Properties of Magnetron Sputtered TiN/TiAlN Multilayers,", Surface and Coatings Technology, Elsevier, Amsterdam, NL., vol. 123, Jan. 1, 2000, pp. 219-226.

(Continued)

*Primary Examiner* — Joseph C Nicely
(74) *Attorney, Agent, or Firm* — Allen, Dyer, Doppelt, Milbrath & Gilchrist, P.A.

(57) ABSTRACT

A method for forming an aluminum titanium nitride layer on a wafer by plasma-enhanced physical vapor deposition including a first step at a radio frequency power ranging between 100 and 500 W only, and a second step at a radio frequency power ranging between 500 and 1,000 W superimposed to a D.C. power ranging between 500 and 1,000 W. An insulated gate comprising such an aluminum titanium nitride layer.

12 Claims, 2 Drawing Sheets

(56) References Cited

U.S. PATENT DOCUMENTS

2009/0316331 A1* 12/2009 Nakabayashi ............... 361/311
2010/0032289 A1* 2/2010 Wang et al. ............. 204/192.12
2010/0260560 A1* 10/2010 Schier ........................ 407/119
2011/0018073 A1* 1/2011 Wang et al. ................. 257/411
2014/0147683 A1* 5/2014 Arndt ......................... 428/446

OTHER PUBLICATIONS

Park et al., The properties of coatings deposited by inductively coupled plasma assisted d.c. magnetron sputtering, Surface and Coatings Technology, Elsevier, Amsterdam, NL, vol. 142-144, Jul. 1, 2001, pp. 999-1004.

Charbonnier et al., "Investigation of Mechanisms Shifting Metal Effective Workfunction Towards P+ for Various Al Incorporation Scenarii," IEEE, Jul. 2010, pp. 84-85.

Veloso et al., "Gate-Last vs. Gate-First Technology for Aggressively Scaled EOT Logic/RF CMOS," 2011 Symposium on VLSI Technology, Digest of Technical Papers, Jun. 2011, pp. 34-35.

Cha et al., "Work Function and Thermal Stability of Ti1-xAlxNy for Dual Metal Gate Electrodes," 2002 American Institute of Physics, Applied Physics Letters, vol. 81, No. 22, Nov. 25, 2002, pp. 4192-4194.

Fenouillet-Beranger et al., "UTBOX and Ground Plane Combined with Al2O3 Inserted in TiN Gate for VT Modulation in Fully-Depleted SOI CMOS Transistors," 2011 International Symposium on VLSI Technology, Systems and Applications (VLSI-TSA), Apr. 2011, 2 pages.

* cited by examiner

METHOD FOR DEPOSITING A LOW-DIFFUSION TIALN LAYER AND INSULATED GATE COMPRISING SUCH A LAYER

CROSS REFERENCE TO RELATED APPLICATION

This application is a translation of and claims the priority benefit of French patent application number 12/59614, filed on Oct. 9, 2012, entitled "METHOD FOR DEPOSITING A LOW-DIFFUSION TIALN LAYER AND INSULATED GATE COMPRISING SUCH A LAYER", which is hereby incorporated by reference to the maximum extent allowable by law.

BACKGROUND

1. Technical Field

The present disclosure relates to insulated-gate transistors. More specifically, the present disclosure relates to insulated-gate transistors formed on thin semiconductor substrates, as well as to a method for manufacturing such transistors.

2. Discussion of the Related Art

It is known to form, on the same solid semiconductor substrate, P-type and N-type MOS transistors. These two types of transistors are different, for example, by the doping type of their channel, by the semiconductor material forming their channel, by the material forming their gate oxide, or by the material forming their gate.

To improve the electrostatic channel control in recent technologies, the thickness of semiconductor substrates inside and on top of which electronic components are formed, as well as the thicknesses of the layers forming the components, have considerably decreased. Such is for example the case for components formed on supports of multiple-gate semiconductor type (known as "FinFET"), or formed on substrates of semiconductor-on-insulator type (SOI). In this last structure, a thin layer of semiconductor material extends on a semiconductor support with an interposed insulating layer.

It has already been provided to decrease the thickness of the upper semiconductor layer of SOI structures to a thickness on the order of a few tens of nanometers, or even of a few nanometers. This technology is known as FD-SOI, for "Fully Depleted SOI". This form of substrate implies additional constraints for the forming of electronic components, and especially of MOS transistors. Indeed, in very thin substrates, it is not possible to define doped wells or to replace a semiconductor material region with another semiconductor material.

Other means have thus been provided to form N-type or P-type MOS transistors on FD-SOI substrates. It has in particular been provided to form insulated gates having different conductive structures, be they N-type or P-type MOS transistors on gate insulators of high dielectric constant ("high-K" dielectric materials). Indeed, with different conductive structures, gates having a variable work function, capable of defining N-type MOS transistors or P-type MOS transistors, are obtained.

Further, two manufacturing methods are conventionally used to form integrated circuits with MOS transistors: a so-called "gate-last" method activation where activation anneals at high temperature (higher than 1,000° C.) of all the doped regions are carried out before the forming of the transistor gates, and a so-called "gate-first" method where the transistor gates are formed at the substrate surface before the phase of activation anneal of all the doped regions of the integrated circuit. In the first case, the transistor gates are only submitted to anneals of interconnect integration type at temperatures which do not exceed 400° C. In the second case, the transistor gates are submitted to at least one anneal at a temperature higher than 1,000° C., which may considerably alter the gate structure and thus the work function of the gate and the transistor parameters.

Last, the gates of P-type MOS transistors have a greater work function than those of N-type MOS transistors and are more complex to manufacture.

A method for manufacturing a P-type MOS transistor compatible with FD-SOI substrates in a gate-first integration is thus needed. Further, there is a need for such a MOS transistor having decreased leakage currents.

SUMMARY

Accordingly, an embodiment provides a method for forming a low-diffusion TiAlN layer.

Another embodiment provides a method for forming a P-type MOS transistor overcoming all or part of the disadvantages of prior art, said transistor extending over an FD-SOI substrate and being compatible with a gate-first type integration.

Another embodiment provides a P-type MOS transistor obtained by means of such a method.

Thus, an embodiment provides a method for forming an aluminum titanium nitride layer on a wafer by plasma-enhanced physical vapor deposition, comprising a first step at a radio frequency power only, and a second step at a radio frequency power superimposed to a D.C. power.

According to an embodiment, the first step is at a radio frequency power ranging between 100 and 500 W and the second step is at a radio frequency power ranging between 500 and 1,000 W superimposed to a D.C. power ranging between 100 and 1,000 W.

According to an embodiment, the first step lasts for between 1.5 and 2.5 seconds.

According to an embodiment, the plasma-enhanced physical vapor deposition uses a target comprising from 65 to 75% of titanium and from 25 to 35% of aluminum, in atomic percentage.

According to an embodiment, the target of the plasma-enhanced physical vapor deposition comprises 70% of titanium and 30% of aluminum in atomic percentage.

An embodiment further provides a method for manufacturing an insulated gate on a support, comprising a step of forming an aluminum titanium nitride layer by the above method.

According to an embodiment, the method comprises a preliminary step of forming an insulating layer of high dielectric constant comprising hafnium.

According to an embodiment, the step of forming an aluminum titanium nitride layer is preceded by a step of forming a titanium nitride layer on the support.

According to an embodiment, the support is a fully depleted support of semiconductor-on-insulator type.

An embodiment further provides a P-type MOS transistor comprising, at the surface of an insulating layer of high dielectric constant comprising hafnium, an insulated gate formed by the above method.

An embodiment further provides an integrated circuit comprising, at the surface of an insulating layer of high dielectric constant comprising hafnium, an insulated gate comprising an aluminum titanium nitride layer formed by the above method, which extends on a titanium layer.

According to an embodiment, the insulating layer of high dielectric constant comprising hafnium has a thickness ranging between 1 and 2.5 nm, the aluminum titanium nitride layer has a thickness ranging between 3 and 4 nm, and the titanium nitride layer has a thickness ranging between 0.8 and 2 nm.

According to an embodiment, the circuit is formed on a semiconductor substrate, an insulating interface layer being provided between the insulating layer of high dielectric constant comprising hafnium and the substrate.

The foregoing and other features and benefits will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of integrated circuits, the various drawings are not to scale.

DETAILED DESCRIPTION

Figure 1:
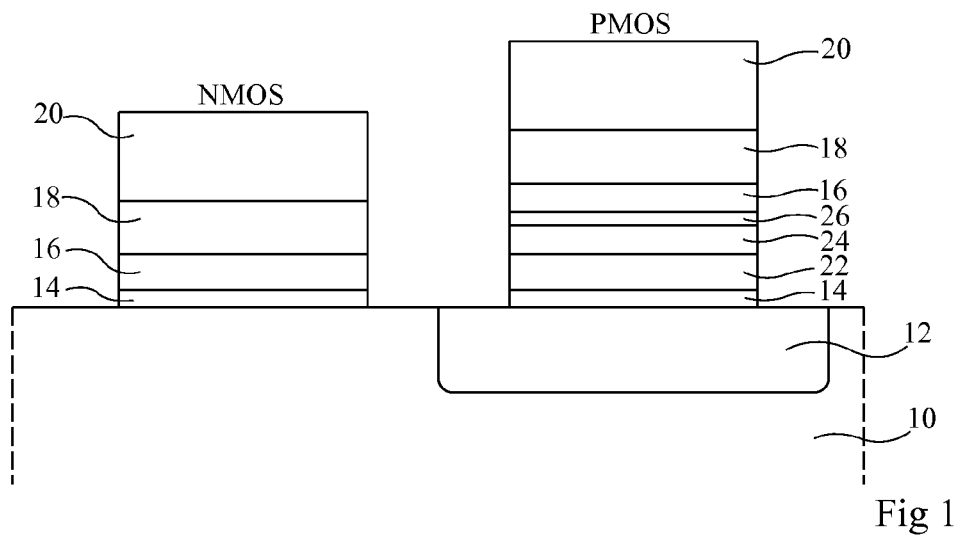
FIG. 1 illustrates a conventional integration of an N-type MOS transistor and of a P-type MOS transistor on a solid substrate.

FIG. 1 illustrates a known structure of a P-type MOS transistor gate and of an N-type MOS transistor gate formed on a same solid semiconductor substrate.

In FIG. 1, a solid semiconductor substrate 10 has a first gate (PMOS) of a P-type MOS transistor and a second gate (NMOS) of an N-type MOS transistor formed thereon. A well 12 is formed at the surface of semiconductor substrate 10 in front of the PMOS gate. Well 12 may for example be a silicon-germanium well, substrate 10 being for example made of silicon.

A stack 14 forming the gate insulator of the PMOS and NMOS gates is provided at the substrate surface. This stack comprises a first insulating layer, which is in practice a so-called interface or pedestal layer made of silicon oxide ($SiO_2$) or of silicon oxynitride (SiON), and a second insulating layer of high dielectric constant (high-K material) containing hafnium, for example, a layer made of hafnium oxide $HfO_2$ which may contain nitrogen and/or silicon (HfSiON).

At the surface of the insulating stack of the NMOS gate is formed a conductive stack comprising, in the shown example, a lanthanum layer 16, a titanium nitride layer 18, and a polysilicon layer 20.

At the surface of insulating stack 14 of the PMOS gate is formed a conductive stack comprising, in the shown example, a titanium nitride layer 22, an aluminum layer 24, a titanium nitride layer 26, a lanthanum layer 16, a titanium nitride layer 18, and a polysilicon layer 20 (layers 16, 18, and 20 of the NMOS and PMOS transistors may be respectively formed during same deposition steps).

The compositions and the different thicknesses of the materials of the NMOS and PMOS gates, as well as the presence of well 12, provide the forming of N- and P-type MOS transistor gates. In particular, a good selection of the thicknesses of the different layers provides the forming of an insulated NMOS transistor gate having a work function smaller than 4.4 eV and the forming of an insulated PMOS transistor gate having a work function greater than 4.8 eV.

Thus, the specific gate structures and the silicon-germanium well on the PMOS transistor gate side provide for the proper operation of the transistors. However, on a very thin SOI-type substrate, of FD-SOI type where the upper semiconductor material layer has a thickness on the order of a few nanometers, or even of a few tens of nanometers, it is for example not possible to form a silicon-germanium well.

It is thus necessary to provide different gate structures to obtain the desired transistor work function. As seen previously, the work function of an N-type MOS transistor gate is smaller than the work function of a P-type MOS transistor gate. It is thus generally easier to design N-type MOS transistors than P-type MOS transistors. The latter are considered herein.

A novel gate structure, compatible with FD-SOI substrates, having a work function adapted to the forming of a P-type MOS transistor gate, is provided. Further, a P-type MOS transistor gate compatible with methods for forming integrated circuits of gate-first type, that is, a gate capable of withstanding high-temperature anneals with no damage to their structures, is provided.

Figures 2A, 2B:
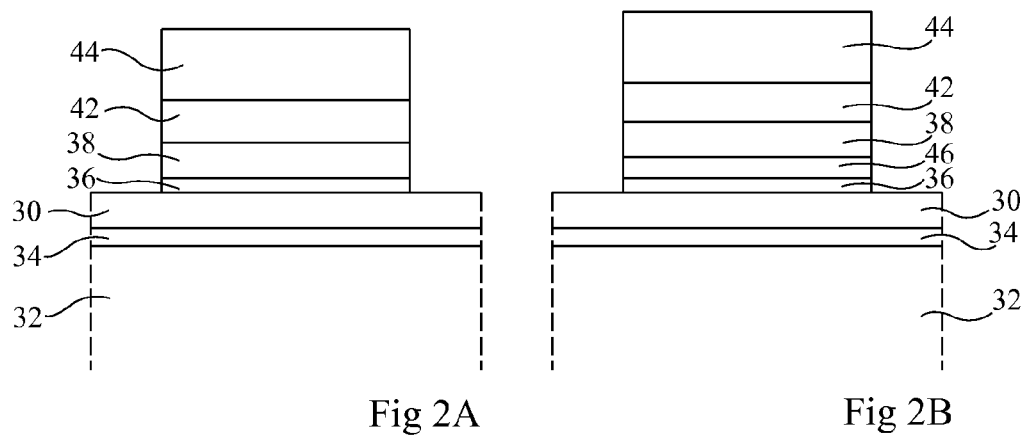
FIGS. 2A and 2B illustrate two alternative embodiments of a P-type MOS transistor gate according to an embodiment.

FIGS. 2A and 2B illustrate two alternative ways of forming a P-type MOS transistor gate according to an embodiment, formed on a semiconductor substrate 30 of FD-SOI type which extends on a semiconductor support 32 with an interposed thin insulating layer 34.

In FIGS. 2A and 2B, semiconductor substrate 30 has an insulating stack 36 comprising a thin layer of an interface insulator, for example, silicon oxide or silicon oxynitride, topped with a high-K dielectric material comprising hafnium, for example, a layer made of hafnium oxide ($HfO_2$) or of hafnium and silicon oxynitride (HfSiON), formed thereon.

In FIG. 2A, at the surface of insulating stack 36 is formed a conductive stack comprising a first low-diffusion layer of aluminum titanium nitride (TiAlN) 38, topped with a layer of titanium nitride TiN 42 and with a polysilicon layer 44.

As an example of dimensions, layer 36 may have a thickness ranging between 1.5 and 3 nm. To achieve this, an interface layer having a thickness ranging between 0.5 and 1.5 nm, preferably 1 nm, and a layer of high-K dielectric material comprising hafnium having a thickness ranging between 1 and 2.5 nm, preferably equal to 1.8 nm, may be provided. Low-diffusion TiAlN layer 38 may have a thickness ranging between 3 and 4 nm, for example, 3.5 nm, titanium nitride layer TiN 42 may have a thickness ranging between 6 and 8 nm, for example, 6.5 nm, and polysilicon layer 44 may have a thickness ranging between 40 and 60 nm, for example, on the order of 50 nm.

In the embodiment of FIG. 2B, the shown gate has the same stack as that of FIG. 2A, except that an additional titanium nitride layer (TiN) is interposed between insulating layer 36 and conductive TiAlN layer 38. The TiN layer has a thickness ranging between 0.8 and 2 nm, for example, a 1-nm thickness.

Advantageously, the two structures provided in FIGS. 2A and 2B each have a work function adapted to the forming of a P-type MOS transistor, and low leakage currents, as well as an adapted ratio of the on-state current to the off-state leakage current (Ion/Ioff), as will be described hereafter.

In the two alternative embodiments of FIGS. 2A and 2B, a low-diffusion TiAlN layer 38 is provided. This property should be respected since the gates of FIGS. 2A and 2B are formed at the beginning of the integrated circuit manufacturing method and that they must be able to withstand high-temperature anneals without changing in such a way as to damage the transistor.

To form a low-diffusion TiAlN layer, an embodiment provides a method for depositing a TiAlN layer in specific deposition conditions, which enable to form, in the TiAlN layer, clusters of aluminum and nitrogen which provide the low diffusivity of the obtained final layer.

It should be noted that the method for depositing a TiAlN layer provided herein may be capable of forming such a layer on any device, integrated or not, independently from the present issue of the forming of a P-type MOS transistor gate on a thin substrate. Indeed, due to its features of high-temperature stability and of resistance to oxidation and to chemical etchings, the TiAlN alloy may be used as a coating in a wide range of applications, such as the protecting of parts for clockwork or space industry, machining tools, semiconductor devices, optical instruments, compressor fins in aeronautics or again biocompatible parts or prostheses for medical applications.

Figure 3:
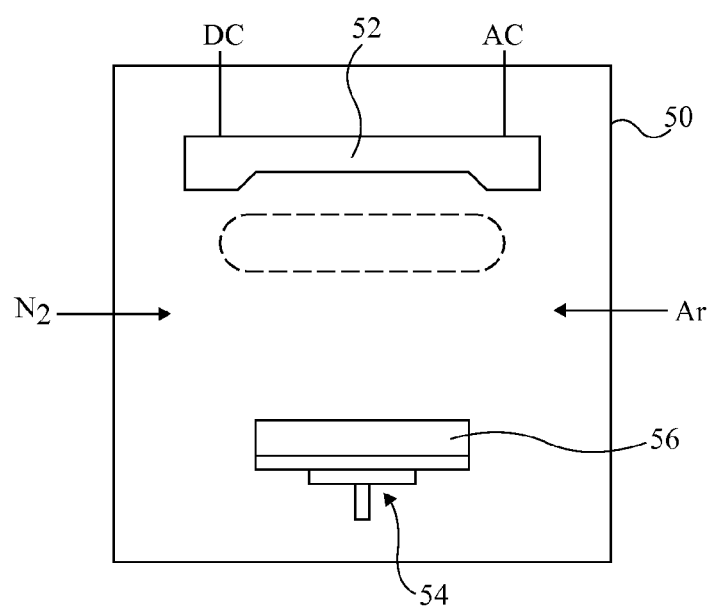
FIG. 3 illustrates a method for forming a low-diffusion TiAlN layer according to an embodiment.

FIG. 3 illustrates the implementation of the method for forming a TiAlN layer provided herein.

To form the TiAlN layer, it is provided to perform a plasma-enhanced physical vapor deposition (better known as PVD). A reactive cathode sputtering chamber used for the deposition of a low-diffusion TiAlN layer is illustrated in FIG. 3.

Chamber 50 contains a target 52 and a support 54 having a wafer 56 on which a TiAlN layer is desired to be deposited arranged thereon. Target 52 comprises a block of a titanium-aluminum alloy of minimum purity equal to 99.99% having a composition capable of varying between 50% of titanium and 50% of aluminum, and 90% of titanium and 10% of aluminum (in atomic percentage).

Wafer 56 is introduced into chamber 50 and a radio frequency (RF) argon and nitrogen plasma capable of bombarding the surface of titanium-aluminum target 52 is created.

The plasma deposition advantageously comprises two steps, a first step during which only the A.C. component, that is, the radio frequency (RF) component, is present, and a second step during which a D.C. component is added to the RF component. The first step may last for between 1.5 and 2.5 seconds, for example, 2 seconds.

During the first step, the A.C. power of the plasma ranges between 100 and 500 W, preferably being on the order of 300 W, at a preferential frequency of 13.56 MHz or at a frequency equal to a multiple or a sub-multiple of this frequency. During the second step, the A.C. power of the plasma (at the same frequency as the first step) ranges between 500 and 1,000 W, and for example is 850 W, and the added D.C. power ranges between 100 and 1,000 W, and for example is 300 W. To obtain a layer having a thickness ranging between 3 and 4 nm, the second step may be carried out for a duration ranging between 60 and 90 seconds, for example, 75 seconds.

As an example, an argon flow rate ranging between 18 and 22 $cm^3$/min, for example, 20 $cm^3$/min, and a nitrogen flow rate ranging between 19 and 50 $cm^3$/min, for example, 21 $cm^3$/min at standard temperature and pressure conditions (0° C. temperature and 1 Atm pressure) are provided. The pressure in deposition chamber 50 during the two steps may range between 1 and 25 mTorr, preferably being approximately 1 mTorr.

Before the deposition, titanium-aluminum alloy target 52 may first be conditioned by sputtering with argon and nitrogen flow rates identical to those used during the deposition process. The obtained effect is a nitriding of the surface of target 52 before the deposition. This method provides a uniform composition of the TiAlN deposition from as soon as the first atomic monolayers at the surface of the gate oxide. Other preparation methods may also be used to adjust the gate leakage current, the equivalent gate capacitance thickness, and the gate threshold voltage. For example, target 52 may initially be partially or totally denitrided so that the first monolayers of the TiAlN deposit at the gate oxide surface are nitrogen-depleted. Such a denitriding of target 52 is performed by an initial sputtering with argon only.

During the deposition, ions from the plasma, by bombarding the surface of the titanium-aluminum alloy of target 52, tear off agglomerates of the alloy. Said agglomerates, projected into the chamber, combine with nitrogen, present in the plasma, before depositing on wafer 56.

Advantageously, the deposition of a TiAlN layer in two steps such as described hereabove enables, in the first step, to form a sheath oscillation plasma little aggressive for the wafer intended to receive the deposition. The second step enables to perform a deposition where the final TiAlN structure comprises compact clusters of aluminum and nitrogen.

The present inventors have noted that this specific deposition method, and thus the forming of such compact clusters, provides the forming of a low-diffusion TiAlN layer, that is, the aluminum present in this layer will not tend to diffuse into adjacent layers after an anneal is performed.

This feature provides a high temperature-stability to the structure of the TiAlN layer. This feature is very advantageous in a gate-first type integration where the gate is impacted by high-temperature anneals for activating the implanted species.

Further, the aluminum present in the layer immediately reacts with the air oxygen to form, at the surface of the TiAlN layer, a very stable native oxide which behaves as a barrier against oxygen. This feature is also very advantageous for the forming of transistors with a high-K gate oxide, since it enables to keep a low amount of oxygen in the gate, and thus, in particular, to guarantee low gate capacitance equivalent thicknesses (CET). Indeed, the preponderating mechanism of operation of the high-K dielectric material comprises the forming of oxygen gaps inside of it.

Further, the present inventors have observed that the immediate forming at the contact with air of a stable and resistant native oxide at the TiAlN surface is a competitive advantage in the PMOS area definition photolithography. Indeed, the native TiAlN oxide provides a much better bonding of the resist than a TiN layer. By avoiding the partial separation of the resin, TiAlN thus enables to increase the high-quality chip yield per manufacturing wafer.

This feature also provides the TiAlN layer structure with a high resistance to chemical etching. This is also an advantage in the forming of perfectly straight gate profiles, whatever the length and the width of the gate, which is not true for a PMOS stack of the type in FIG. 1. Due to a more homogeneous gate etching, TiAlN enables to have all electric parameters of the transistors comply with specifications, whatever the transistor dimensions.

In the case of the forming of a gate such as that of FIGS. 2A and 2B, it should be noted that a composition comprising between 65 and 75% of titanium and between 25 and 35% of aluminum (in atomic percentage) will be preferred. More specifically, a target 52 comprising 70% of titanium and 30% of aluminum may be preferred. Such a target composition enables to obtain a TiAlN film having an average composition of approximately 15% of aluminum, approximately 34% of titanium, and approximately 51% of nitrogen in atomic percentage, the proportion of nitrogen being capable of varying along with the ratio of the argon/nitrogen gas flow rates used during the deposition, the ratio of the titanium and aluminum proportions being set by the target.

A minimum 25% of aluminum in atomic percentage is indeed needed in the target for a continuous protective aluminum oxide layer to form at the surface of the TiAlN layer. However, if there is too much aluminum, for example, if there is more than 50% of aluminum in atomic percentage, the compact aluminum nitride clusters are no longer efficient to block the diffusion of aluminum through the gate oxide (high-K dielectric). Now, the excessive presence of aluminum in the high-K is known to alter the gate leakage current. As a summary, for a proper gate operation, it is preferable for some aluminum to pass into the high-K dielectric material to create a dipole effect, but not too much. More specifically, a target 52 comprising 70% of titanium and 30% of aluminum in atomic percentage will be preferred.

Figure 4:
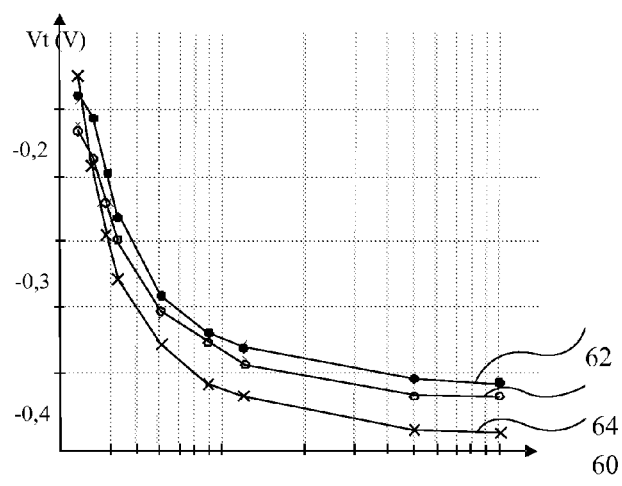
FIG. 4 illustrates curves of the threshold voltage of PMOS transistors according to their gate length for various gate structures.

FIG. 4 shows curves of the threshold voltage of MOS transistors according to their gate lengths and to the composition of their gates.

The curve of FIG. 4 shows threshold voltage values versus the transistor gate length for various P-type MOS transistor gates. This drawing compares such curves for known P-type MOS transistors and transistors according to an embodiment (obtained by means of a preferred target 52 comprising 70% of titanium and 30% of aluminum, in atomic percentage).

In this drawing, a first curve 60, having its characteristic points marked with crosses, illustrates the threshold voltage of a known P-type MOS transistor, such as that of FIG. 1; a second curve 62, having its characteristic points marked with full dots, illustrates the threshold voltage of a P-type MOS transistor such as in FIG. 2B; and a third curve 64, having its characteristic points marked with circles, illustrates the threshold voltage of different P-type MOS transistors, such as that in FIG. 2A.

As can be seen in this curve, the forming of a gate such as described in FIGS. 2A and 2B substantially decreases the PMOS transistor threshold voltage, whatever the gate length, which is very positive for the forming of PMOS transistors on a FD-SOI substrate.

Figure 5:
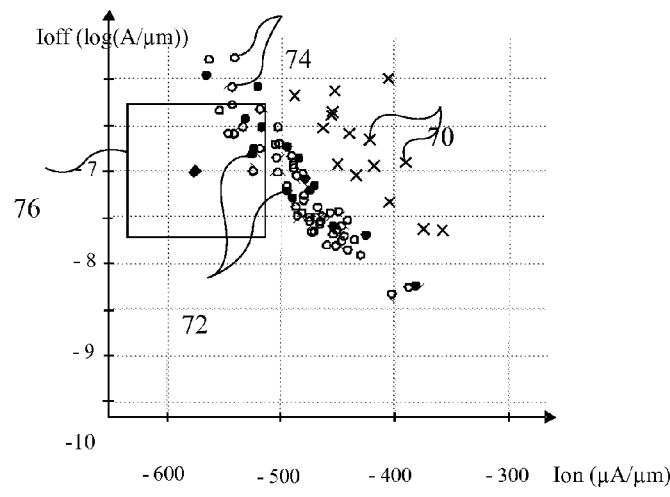
FIG. 5 illustrates values of the off-state current of PMOS transistors according to their on-state current for various gate structures.

FIG. 5 shows values of the off-state current of PMOS transistors according to the on-state current and to the composition of their gates (the transistors according to an embodiment comprising a TiAlN layer obtained by means of a preferred target with 70% of titanium and 30% of aluminum, in atomic percentage).

More specifically, FIG. 5 illustrates, on a set of samples of known P-type MOS transistors (of the type in FIG. 1) or of the type in FIGS. 2A and 2B, the value of the off-state current according to the on-state current. In the same way as for FIG. 4, values 70 for known transistors such as that in FIG. 1 are marked with crosses in FIG. 5, values 72 for transistors of the type in FIG. 2B are marked with full dots, and value 74 for transistors of the type in FIG. 2A are marked with circles.

Advantageously, as can be seen in this drawing, the transistors according to an embodiment of FIGS. 2A and 2B have higher on-state currents than prior art transistors, for similar or lower off-state currents. FIG. 5 illustrates a frame 76 which shows the optimal values desired by the present inventors in terms of on-state and off-state currents for P-type MOS transistors. It can be seen that the forming of a gate such as described in relation with FIGS. 2A and 2B provides the forming of such transistors, or at least enables to approach this goal.

Figure 6:
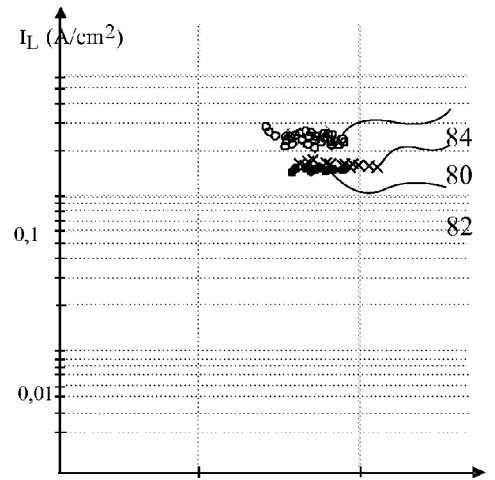
FIG. 6 illustrates value of the gate leakage current of PMOS transistors according to the equivalent gate capacitance thickness for various gate structures.

FIG. 6 shows values of the leakage currents of PMOS transistors according to the gate capacitance equivalent thickness of these gates and to the composition of these gates (the transistors according to an embodiment comprising a TiAlN layer obtained by means of a preferred target 52 with 70% of titanium and 30% of aluminum, in atomic percentage).

More specifically, FIG. 6 illustrates, on a set of samples of known P-type MOS transistors (of the type in FIG. 1) or of the type in FIGS. 2A and 2B, the value of the leakage currents according to the gate capacitance equivalent thickness (CET). The gate capacitance equivalent thickness is defined as being the silicon oxide thickness equivalent, in terms of capacitance in farads measured for the PMOS transistor, to the gate insulator used in practice for this transistor (in the present case, stack 36 of the silicon oxide layer and of the high-K layer comprising hafnium). By using a common reference (silicon oxide), the CET thickness enables to compare various transistors having different gate oxides.

As previously, values 80 correspond to known transistors such as that in FIG. 1 and are marked with crosses in FIG. 5, values 82 correspond to transistors of the type in FIG. 2B and are marked with full dots, and values 84 correspond to transistors of the type in FIG. 2A and are marked with circles.

As can be seen in the drawing, the forming of gates such as that illustrated in FIG. 2B provides a decrease of leakage currents with respect to known transistors. Gates such as that illustrated in FIG. 2A have leakage currents of the same order as those of known transistors.

It should be noted that the forming of P-type transistors such as described hereabove, with a gate having a stack of TiN/TiAlN type, on a same circuit as N-type MOS transistors, advantageously enables to obtain N-type MOS transistors having lower leakage currents than known transistors, by on the order of 30%. This effect of the nature of the gate of PMOS transistors on the performance of NMOS transistors results from the co-integration of these two transistors on a same circuit (to form a CMOS): the PMOS gate is first deposited all over, and then removed from the areas corresponding to NMOS transistors. Thus, advantage may be taken of the forming of gates such as those of FIGS. 2A and 2B to form improved N-type MOS transistor gates.

Specific embodiments of the present invention have been described. Various alterations and modifications will occur to those skilled in the art. In particular, if desired, the TiAlN layer may be deposited to have a nitrogen gradient across its thickness. To achieve this, it may be provided to denitride the TiAlN target before performing the TiAlN deposition on the device.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming an aluminum titanium nitride layer (TiAlN) on a semiconductor substrate by a plasma-enhanced physical vapor deposition, comprising:

denitriding a titanium-aluminum (TiAl) sputtering target; and discharging from the TiAl sputtering target an argon and nitrogen plasma onto the semiconductor substrate in a first step at a radio frequency power, and in a second step at a radio frequency power superimposed to a D.C. power.

2. The method of claim 1, wherein the first step is at a radio frequency power ranging between 100 and 500 W and the second step is at a radio frequency power ranging between 500 and 1,000 W superimposed to the D.C. power ranging between 100 and 1,000 W.

3. The method of claim 1, wherein the first step lasts for between 1.5 and 2.5 seconds.

4. The method of claim 1, wherein the the TiAl sputtering target comprises from 65 to 75% of titanium and from 25 to 35% of aluminum, in atomic percentage.

5. The method of claim 1, wherein the TiAl sputtering target comprises 70% of titanium and 30% of aluminum in atomic percentage.

6. A method for manufacturing an insulated gate on a semiconductor substrate comprising:
    denitriding a titanium-aluminum (TiAl) sputtering target;
    discharging from the TiAl sputtering target an argon and nitrogen plasma onto the semiconductor substrate to form an aluminum titanium nitride layer (TiAlN) on the semiconductor substrate; and
    forming a conductive stack over the TiAlN layer to define the insulated gate.

7. The method of claim 6, further comprising forming an insulating layer comprising hafnium before forming the TiAlN layer.

8. The method of claim 6, further comprising forming a titanium nitride layer on the semiconductor substrate.

9. The method of claim 6, wherein the semiconductor substrate comprises a fully depleted semiconductor substrate of semiconductor-on-insulator type.

10. A method of forming an integrated circuit comprising:
    forming a titanium nitride layer over a semiconductor substrate;
    denitriding a titanium-aluminum (TiAl) sputtering target;
    discharging from the TiAl sputtering target an argon and nitrogen plasma at the semiconductor substrate to form an aluminum titanium nitride layer (TiAlN) over the semiconductor substrate;
    forming a conductive stack over the TiAlN layer as the insulated gate; and
    forming a hafnium layer before the TiAlN layer.

11. The method of claim 10, wherein the hafnium layer has a thickness between 1 and 2.5 nm, and the TiAlN layer has a thickness between 3 and 4 nm.

12. The method of claim 10, comprising forming an insulating interface layer is between the hafnium layer and the semiconductor substrate.

* * * * *